United States Patent
Lin et al.

(12) United States Patent (10) Patent No.: US 9,887,249 B2
(45) Date of Patent: Feb. 6, 2018

(54) DISPLAY DEVICE WITH SELF-ILLUMINATION LAYER

(71) Applicant: AU Optronics Corporation, Hsin-Chu (TW)

(72) Inventors: Yu-Hsin Lin, Hsin-Chu (TW); Chun-Hsin Liu, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 15/588,901

(22) Filed: May 8, 2017

(65) Prior Publication Data

US 2017/0345878 A1 Nov. 30, 2017

(30) Foreign Application Priority Data

May 31, 2016 (TW) .............................. 105117071 A (51) Int. Cl.
*H01L 29/08* (2006.01)
*H01L 35/24* (2006.01)
*H01L 51/00* (2006.01)
*H01L 27/32* (2006.01)
*G09G 3/3225* (2016.01)

(52) U.S. Cl.
CPC ....... *H01L 27/3244* (2013.01); *G09G 3/3225* (2013.01); *H01L 27/3206* (2013.01); *G09G 2320/08* (2013.01)

(58) Field of Classification Search
CPC ..... H01L 25/167; H01L 25/18; H01L 27/146; H01L 27/14601; H01L 27/14636; H01L 27/14645; H01L 27/1464; H01L 27/307; H01L 27/3234; H01L 27/3237; H01L 27/3241; H01L 27/3244; H01L 27/3206; G09G 3/3225; G09G 2320/08
See application file for complete search history.

(56) References Cited

U.S. PATENT DOCUMENTS

| | | | |
|---|---|---|---|
| 2005/0062910 A1 | 3/2005 | Chu et al. | |
| 2013/0113688 A1* | 5/2013 | Choi | G09G 3/3266 345/76 |
| 2015/0069373 A1* | 3/2015 | Lee | H01L 27/323 257/40 |

FOREIGN PATENT DOCUMENTS

| | | |
|---|---|---|
| TW | M305937 U | 2/2007 |
| TW | 200915920 A | 4/2009 |

\* cited by examiner

*Primary Examiner* — Thanh Y Tran
(74) *Attorney, Agent, or Firm* — WPAT, PC (57) ABSTRACT

A display device including a control circuit layer and a self-illumination layer is provided. The control circuit layer has a plurality of control circuit blocks distributed along a cross direction. The self-illumination layer is disposed on the control circuit layer and has a plurality of self-illumination blocks distributed along the cross direction. The self-illumination blocks respectively connect to corresponding control circuit blocks. In the cross direction, the self-illumination block extends an offset distance out of the corresponding control circuit block toward a first side. A self-illumination block closer to the first side has a larger offset distance.

11 Claims, 7 Drawing Sheets

DISPLAY DEVICE WITH SELF-ILLUMINATION LAYER

BACKGROUND

Technical Field

The present invention relates to a display device, and specifically to a self-illumination display device having an effect of enlarging a display range.

Related Art

Flat and curved display devices have been widely applied to various electronic devices, for example, mobile phones, personal wearable apparatuses, televisions, vehicular navigation hosts, personal computers, digital cameras, and palm-top video games. Except an electronic device that is used independently, multiple display devices may be combined to form a large-scale display screen, to display information in a wide range. However, regardless of an application or a type of a display device, shortening frame widths is an objective pursued in the present technology.

Figure 1:
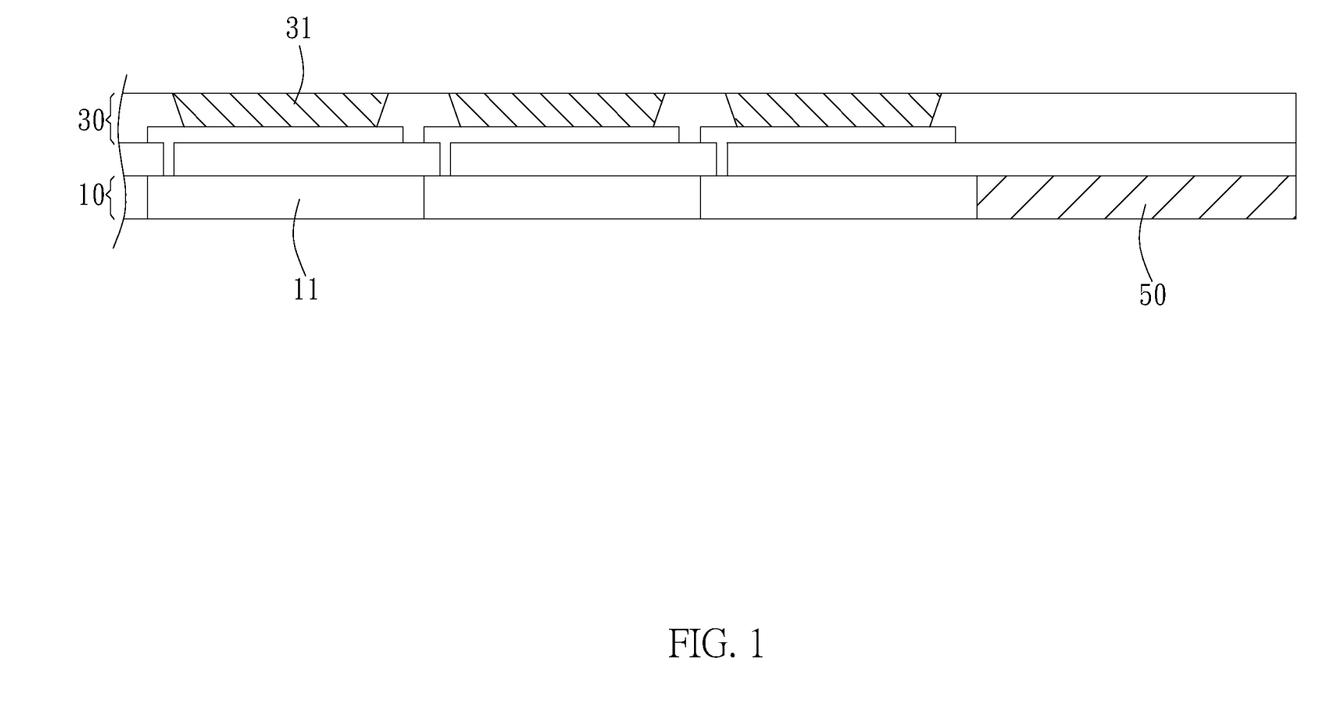
FIG. 1 is a schematic diagram of a conventional organic light emitting diode display device.

Using a conventional organic light emitting diode display device as an example, as shown in FIG. 1, the display device includes a thin film transistor circuit layer 10 and an organic light emitting diode layer 30. For the organic light emitting diode layer 30, a plurality of organic light emitting diode units 31 are arranged to form a display area, and the thin film transistor circuit layer 10 includes a plurality of pixel control circuit units 11 that respectively control luminance of the corresponding organic light emitting diode units 31. The organic light emitting diode units 31 are respectively disposed on the corresponding pixel control circuit units 11, and are connected to each other by means of through-holes and a connection line.

As shown in FIG. 1, a line part 50 for outer lead bonding (OLB) is disposed on an outer edge zone of the thin film transistor circuit layer 10. The organic light emitting diode units 31 are all located above the pixel control circuit units 11, and the line part 50 is located outside the thin film transistor circuit layer 10 formed by the pixel control circuit units 11. Therefore, there is no organic light emitting diode unit 11 above the line part 50, and a non-display area is formed. In this way, seeing from the visual effect, the non-display area is a frame outside the display area. The effect of narrowing the frame can be achieved by effectively reducing the non-display area.

SUMMARY

An objective of the present invention is to provide a display device, to enlarge a display range.

Another objective of the present invention is to provide a display device, to hide at least a part of a line at an edge zone under a display area.

In an embodiment, a display device includes a control circuit layer and a self-illumination layer. The control circuit layer has a plurality of control circuit blocks distributed along a cross direction. The self-illumination layer is disposed on the control circuit layer, and has a plurality of self-illumination blocks distributed along the cross direction. The plurality of self-illumination blocks respectively correspond to the plurality of control circuit blocks, and the self-illumination blocks are in signal connection with the corresponding control circuit blocks. In the cross direction, the self-illumination block extends an offset distance out of the corresponding control circuit block toward a first side, and a self-illumination block closer to the first side has a larger offset distance. Because the self-illumination blocks are arranged along the same cross direction, the offset distance may be continuously accumulated, so that the offset distance is larger when the self-illumination block is closer to the first side.

In another embodiment, a control circuit layer has a first control circuit block and a second control circuit block that are adjacently arranged along a cross direction. A self-illumination layer is disposed on the control circuit layer, and has a first self-illumination block and a second self-illumination block that are adjacently arranged along the cross direction. The first self-illumination block and the second self-illumination block correspond to and are in signal connection with the first control circuit block and the second control circuit block respectively.

In the cross direction, the first self-illumination block has a side toward the second self-illumination block, and the side extends a first offset distance out of a side of the first control circuit block toward the second control circuit block. The second self-illumination block has a side away from the first self-illumination block, and the side extends a second offset distance out of a side of the second control circuit block away from the first control circuit block. The second offset distance is greater than the first offset distance. Because the first self-illumination block and the second self-illumination block are arranged along the same cross direction, a difference of subtracting the first offset distance from the second offset distance may be accumulated, so that the offset distance is greater when closer to the first side.

DETAILED DESCRIPTION

The present invention provides a display device having a self-illumination layer. In an embodiment, the display device includes an active-matrix organic light emitting diode display, but is not limited thereto. The self-illumination layer is preferably formed by organic light emitting diodes, and the self-illumination layer may be formed by other materials in different embodiments.

Figure 2:
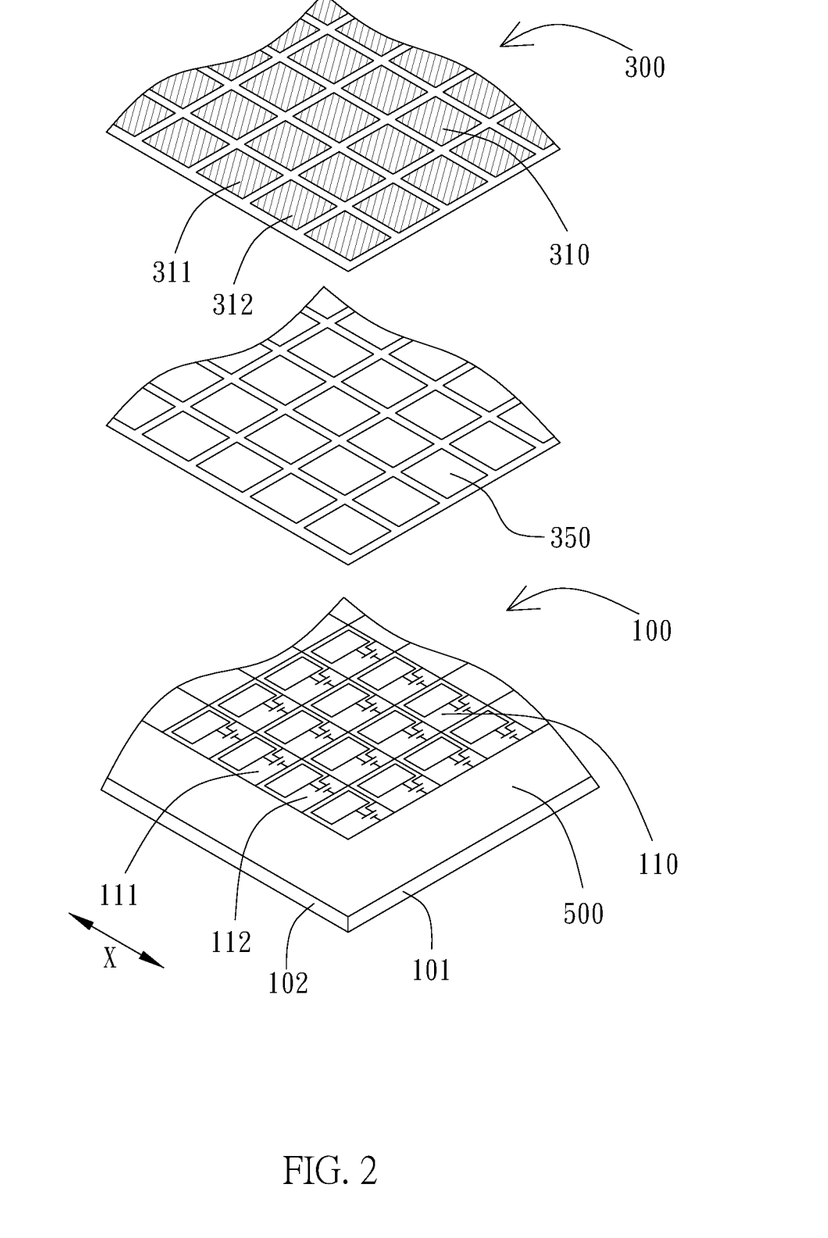
FIG. 2 is an exploded view of components of an embodiment of a display device according to the present invention.

In an embodiment shown in FIG. 2, a display device includes a control circuit layer 100 and a self-illumination layer 300. The control circuit layer 100 has a plurality of control circuit blocks 110 distributed along a cross direction X, and for the entire control circuit layer 100, the control circuit blocks 110 are preferably distributed in a matrix manner. The matrix distribution includes but is not limited to orthogonal-matrix distribution, and may further include cellular-matrix distribution or other periodical distribution formed by arranging irregular shapes in a regular or repeated manner. The cross direction X preferably refers to a direction crossing over the entire control circuit layer 100 and parallel to a side of the control circuit layer 100. In this embodiment, the cross direction X is preferably perpendicular to a first side 101 of the display device and parallel to a second side 102, and the first side 101 and the second side 102 preferably refer to two entity edges of the display device that are perpendicular to each other. The control circuit blocks 110 are preferably control circuits formed by thin-film transistors, and are disposed corresponding to pixels or sub pixels of the display device. Each control circuit block 110 includes two thin film transistors to respectively control on and off of charging and an electric voltage of the charging of the block. A range of the control circuit blocks 110, for example, may be a range formed by interlaced signal lines (for example, scanning lines and data lines). However, the range may be divided by forming a repeatedly changing structure in a matrix form on the control circuit layer 100. A shape of the range of the control circuit blocks 110 is preferably a quadrangle, or may be another polygon or irregular shape. In a preferred embodiment, the control circuit blocks 110 include a first control circuit block 111 and a second control circuit block 112 that are adjacently arranged along the cross direction X. In this embodiment, the first control circuit block 111 and the second control circuit block 112 respectively correspond to neighboring sub pixels, and in different embodiments, the first control circuit block 111 and the second control circuit block 112 respectively correspond to neighboring pixels.

As shown in FIG. 2, the self-illumination layer 300 is disposed on the control circuit layer 100. This embodiment is described by using a final image display direction as an upper side. The self-illumination layer 300 has a plurality of self-illumination blocks 310 distributed along the cross direction X, and for the entire self-illumination layer 300, the self-illumination blocks 310 are preferably distributed in a matrix manner. The matrix distribution includes but is not limited to orthogonal-matrix distribution, and may further include cellular-matrix distribution or other periodical distribution formed by arranging irregular shapes in a regular or repeated manner. In this embodiment, the self-illumination blocks 310 are preferably sub pixels formed by organic light emitting diodes and respectively correspond to the control circuit blocks 110. However, in different embodiments, the self-illumination blocks 310 may include multiple sub pixels, and multiple sub pixels form a complete pixel range. The self-illumination blocks 310 may be in signal connection with the corresponding control circuit blocks 110 by using electrodes 350 below, so that the control circuit blocks 110 control the self-illumination blocks to generate light rays. The self-illumination blocks 310 may have different colors, for example, red, green, blue, and white, and each color is periodically distributed on the entire self-illumination layer 300. A range of the self-illumination blocks 310 is preferably a distribution range of light-emitting materials, and the range may also be divided by forming a repeatedly changing structure in a matrix form on the self-illumination layer 300. Therefore, a structure used as an interval between light-emitting materials may be included. The range of the self-illumination blocks 310 is preferably a quadrangle, or may be another polygon or irregular shape. In a preferred embodiment, the self-illumination blocks 310 include a first self-illumination block 311 and a second self-illumination block 312 adjacently arranged along the cross direction X. The first self-illumination block 311 and the second self-illumination block 312 correspond to and are in signal connection with the first control circuit block 111 and the second control circuit block 112 respectively.

Figure 3:
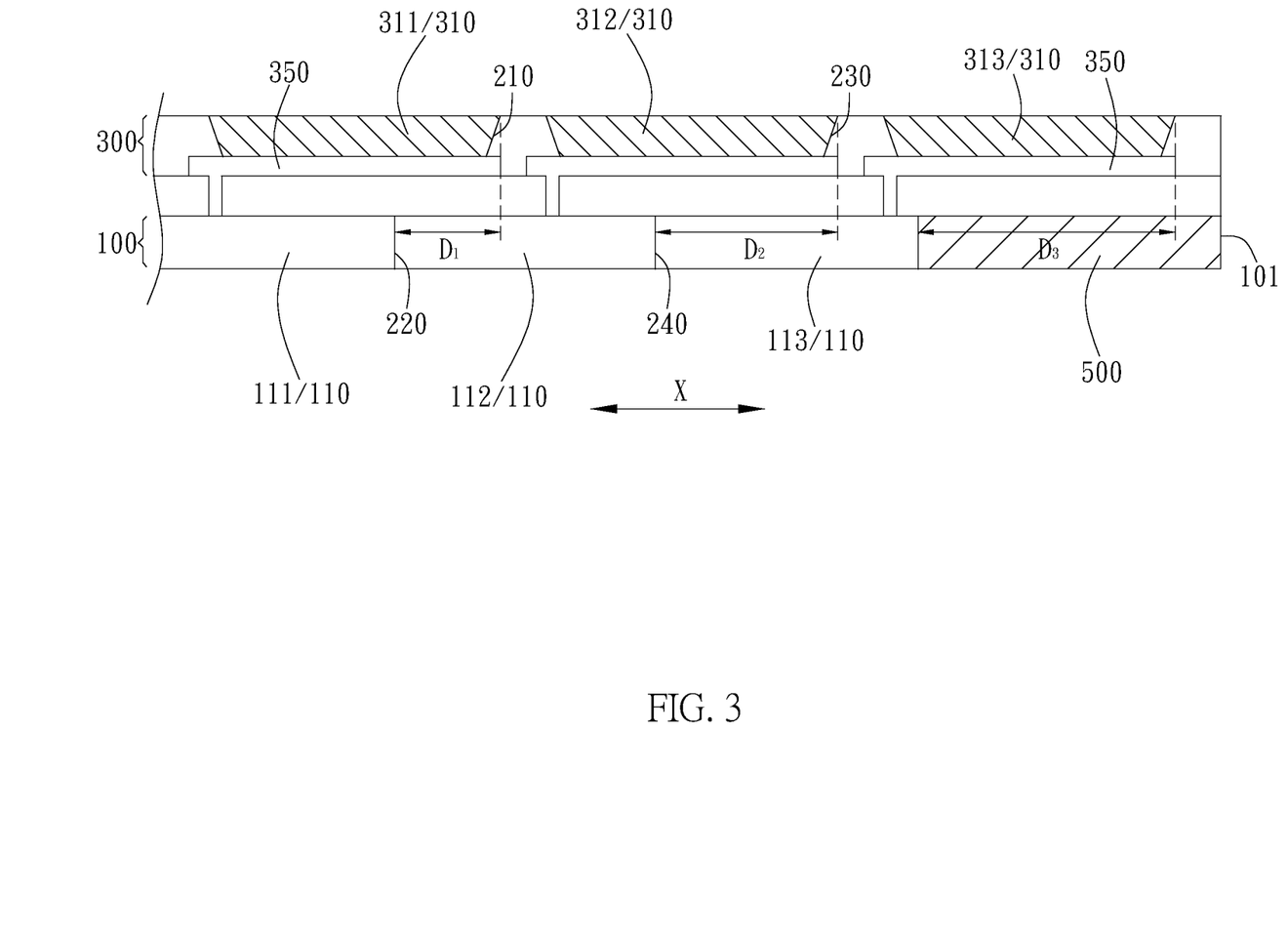
FIG. 3 is a sectional view of the embodiment shown in FIG. 2.

FIG. 3 is a schematic diagram of a section perpendicular to a display surface along the cross direction X. In the cross direction X, the self-illumination blocks 310 extend an offset distance D out of the corresponding control circuit blocks 110 toward the first side 101. Compared with a self-illumination block 310 away from the first side 101, a self-illumination block 310 closer to the first side 101 has a larger offset distance D. In other words, a self-illumination block 310 closer to the first side 101 may extend more out of a corresponding control circuit block 110. Specifically, using a first self-illumination block 311, a second self-illumination block 312, and a third self-illumination block 313 as an example, the first self-illumination block 311 has a side 210 toward the second self-illumination block 312, and the side 210 extends a first offset distance $D_1$ out of a side 220 of the first control circuit block 111 that is toward the second control circuit block 112. The second self-illumination block 312 has a side 230 away from the first self-illumination block 311, and the side 230 extends a second offset distance $D_2$ out of a side 240 of the second control circuit block 112 away from the first control circuit block 111. The second offset distance $D_2$ is greater than the first offset distance $D_1$. In addition, the third self-illumination block 313 at the right side (a side toward the first side 101) of the second self-illumination block 312 extends an offset distance $D_3$ out of a corresponding third control circuit block 113, and the third offset distance $D_3$ is greater than the second offset distance $D_2$. Because the self-illumination blocks are arranged along the same cross direction X, a difference of subtracting the first offset distance $D_1$ from the second offset distance $D_2$ and a difference of subtracting the second offset distance $D_2$ from the third offset distance $D_3$ may be accumulated, so that the offset distance gradually becomes larger. Therefore, the third offset distance $D_3$ of the self-illumination block closest to the first side 101 is the largest. In other words, a mismatch between the self-illumination block 310 above and the corresponding control circuit block 110 below is greater.

As shown in FIG. 3, an edge zone 500 is disposed outside a circuit control block 110 closest to the first side 101. The edge zone 500 preferably includes a line for OLB, or may include another edge conduction line. For the third self-illumination block 313 closest to the first side 101, the third self-illumination block 313 already extends a certain distance (at least the third offset distance D3) out of the corresponding third control circuit block 113 below. Therefore, the edge zone 500 may be totally covered or at least a part of the edge zone 500 may be covered. By means of this design, an effect of increasing a display area may be achieved, and a width of a frame of the display device is shortened.

Figure 4:
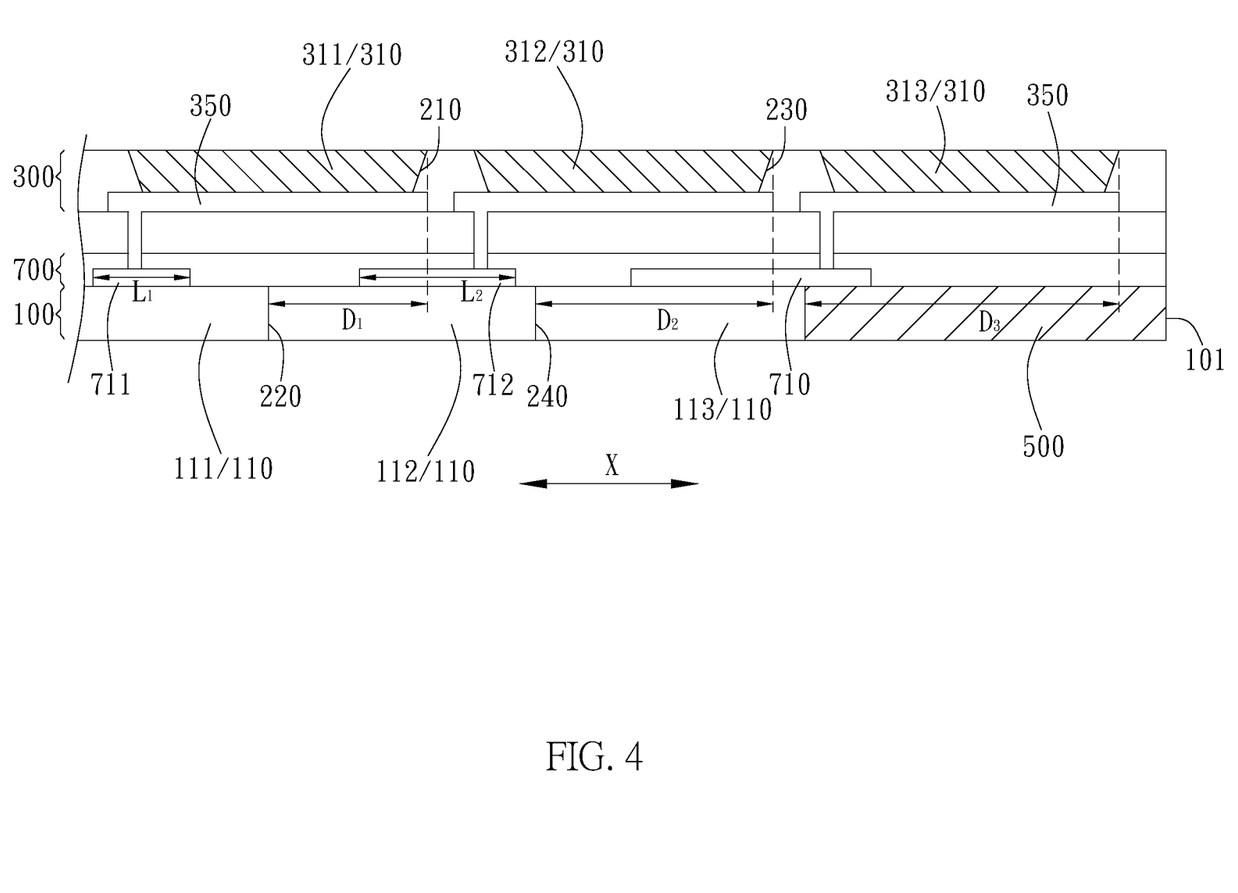
FIG. 4 is a sectional view of another embodiment of a display device.

In addition, as shown in FIG. 4, a connection layer 700 may be disposed between the control circuit layer 100 and the self-illumination layer 300 for conducting signals. The connection layer 700 includes a plurality of connection lines 710 that may be preferably formed by using metal or other electrically conductive materials. Two ends (two sides) of each connection line 710 are respectively connected to a control circuit block 110 and a self-illumination block 310 that correspond to each other. For example, one end of a first connection line 711 is connected to the first control circuit block 111, and the other end is connected to the first self-illumination block 311; and one end of a second connection line 712 is connected to the second control circuit block 112, and the other end is connected to the second self-illumination block 312. For a projection length in the cross direction X, a connection line 710 closer to the first side 101 has a longer projection length. For example, a projection length $L_2$ of the second connection line 712 in the cross direction X is greater than a projection length $L_1$ of the first connection line 711 in the cross direction X.

Figure 5:
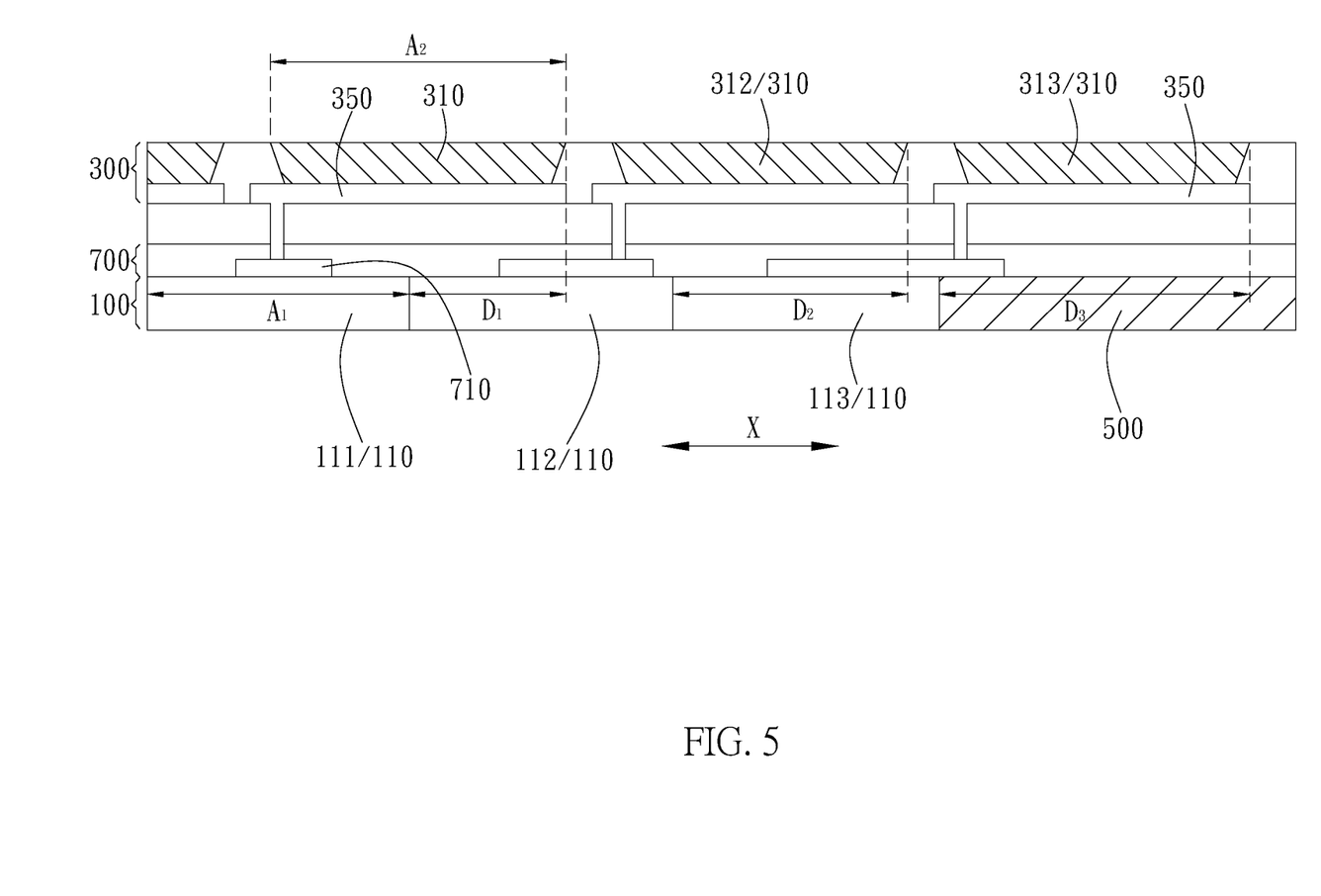
FIG. 5 is a sectional view of another embodiment of a display device.

To achieve the accumulation effect of the offset distance D, the following implementation manner may be used. In an embodiment in FIG. 5, the control circuit blocks 110 have an average width $A_1$ in the cross direction X, the self-illumination blocks 310 have an average width $A_2$ in the cross direction X, and the width $A_2$ is greater than the width $A_1$. When the control circuit blocks 110 and the self-illumination blocks 310 are rectangles, the width $A_1$ and the width $A_2$ are respectively lengths of sides parallel to the cross direction X. However, shapes of the control circuit blocks 110 and the self-illumination blocks 310 on a plane parallel to the control circuit layer 100 and the self-illumination layer 300 may be other shapes except rectangle. Therefore, the width $A_1$ and the width $A_2$ may respectively be average values of sectional widths in the cross direction X.

Figure 6:
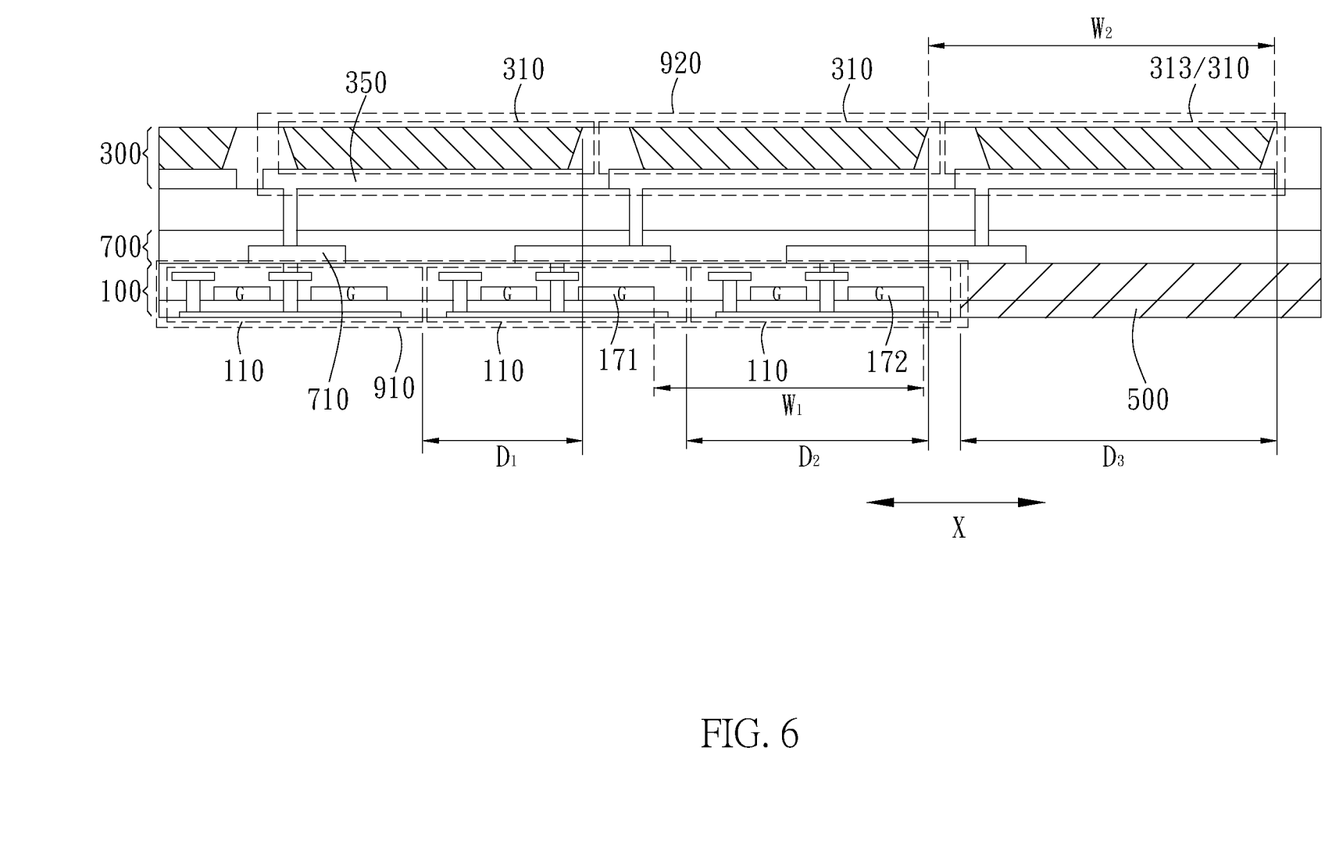
FIG. 6 is a sectional view of another embodiment of a display device.

In an embodiment in FIG. 6, arrangement of the control circuit blocks 110 in the cross direction X forms a first continuous structure 910 that periodically changes, and the first continuous structure 910 displays a repeated structural feature every first distance $W_1$. In other words, a repeated structural feature exists between each control circuit block 110 and a neighboring control circuit block 110, and a spacing between corresponding structural features of neighboring control circuit blocks 110 is the first distance $W_1$. For example, a gate 171 in the control circuit blocks 110 may be used as the repeated structural feature, and it may be defined that a distance between sides of the gate 171 and a gate 172 in neighboring control circuit blocks 110 is the first distance $W_1$. Arrangement of the self-illumination blocks 310 in the cross direction X forms a second continuous structure 920 that periodically changes, and the second continuous structure 920 displays a repeated structural feature every second distance $W_2$. In other words, a repeated structural feature exists between each self-illumination block 310 and a neighboring self-illumination block 310, and a spacing between corresponding structural features of neighboring self-illumination blocks 310 is the second distance $W_2$. For example, an outer-most edge of a substantial light-emitting area in the self-illumination blocks 310 may be used as the repeated structural feature, and it may be defined that a distance between outer-most edges of respective substantial light-emitting areas in neighboring self-illumination blocks 310 is the second distance $W_2$. The second distance $W_2$ is preferably greater than the first distance $W_1$, to achieve the accumulation effect of the offset distance D.

Figure 7:
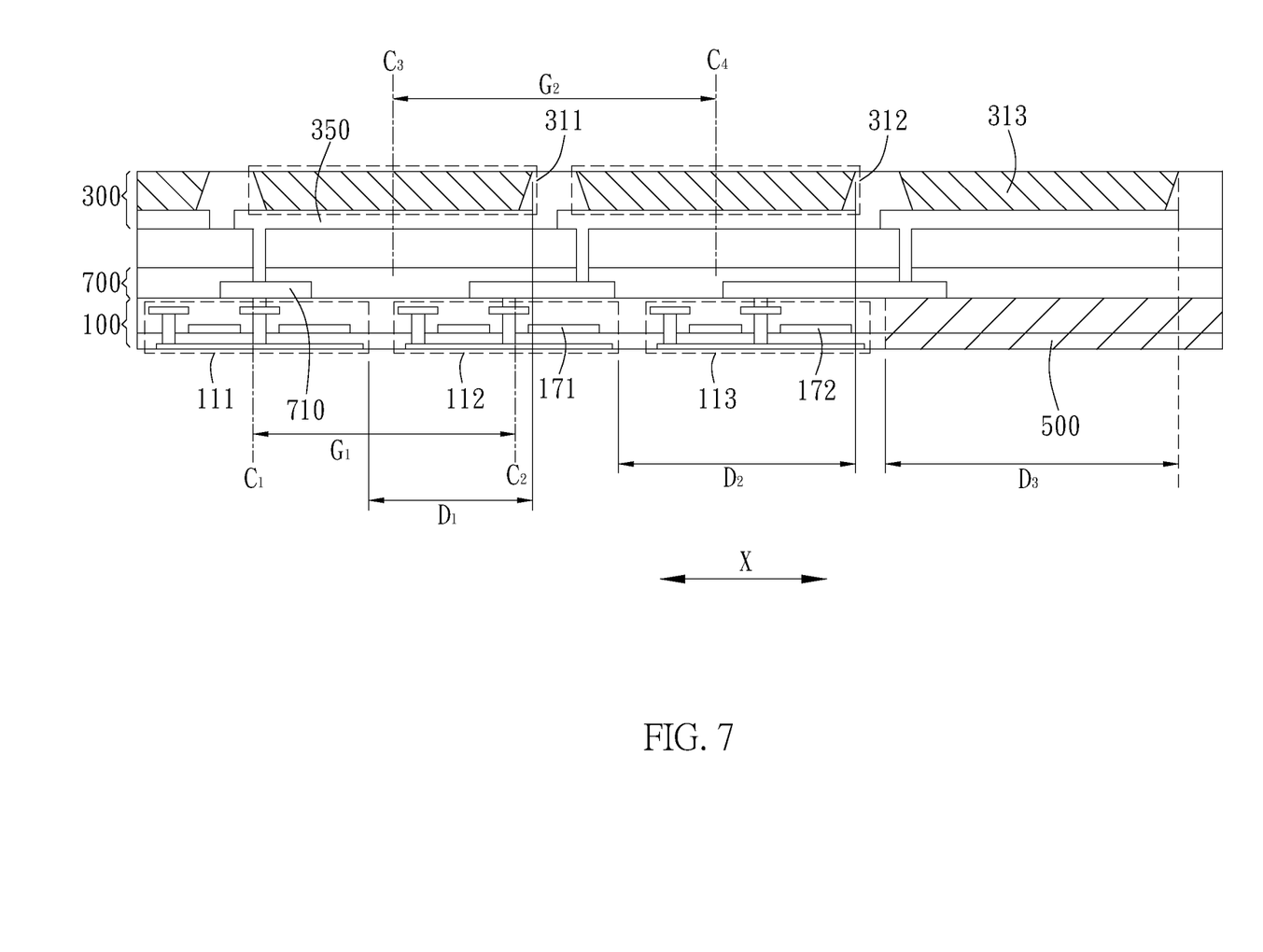
FIG. 7 is a sectional view of another embodiment of a display device.

In an embodiment shown in FIG. 7, in the cross direction X, a distance between a center $C_1$ of a width of the first control circuit block 111 and a center $C_2$ of a width of the second control circuit block 112 is a first spacing $G_1$. In addition, a distance between a center $C_3$ of a width of the first self-illumination block 311 and a center $C_4$ of a width of the second self-illumination block 312 is a second spacing $G_2$. The second spacing $G_2$ is preferably greater than the first spacing $G_1$, to achieve the accumulation effect of the offset distance D. When the first control circuit block 111, the second control circuit block 112, the first self-illumination block 311, and the second self-illumination block 312 are rectangles, the centers $C_1$, $C_2$, $C_3$, and $C_4$ are respectively middle points of sides parallel to the cross direction X. However, shapes of the first control circuit block 111, the second control circuit block 112, the first self-illumination block 311, and the second self-illumination block 312 on a plane parallel to the control circuit layer 100 and the self-illumination layer 300 may be other shapes except the rectangle. Therefore, the centers $C_1$, $C_2$, $C_3$, and $C_4$ are preferably respectively center positions of the shapes of the first control circuit block 111, the second control circuit block 112, the first self-illumination block 311, and the second self-illumination block 312.

The present invention is described by using the foregoing related embodiments, but the embodiments described above are merely examples for implementing the present invention. It should be noted the embodiments that have been disclosed do not limit the scope of the present invention. On the contrary, modifications and equivalent sets that are included in the spirit and range of the scope of this application are all included in the scope of the present invention.

What is claimed is:

1. A display device, comprising:
   a control circuit layer, having a first control circuit block and a second control circuit block wherein the first control circuit block and the second control circuit block are adjacently arranged along a cross direction; and
   a self-illumination layer, disposed on the control circuit layer, and having a first self-illumination block and a second self-illumination block wherein the first self-illumination block and the second self-illumination block are adjacently arranged along the cross direction and respectively correspond to the first control circuit block and the second control circuit block for signal connection;
   wherein, in the cross direction, a first offset distance is between a first self-illumination block side of the first self-illumination block and a first control circuit block side of the first control circuit block, the first self-illumination block side is adjacent to the second self-illumination block, and the first control circuit block side is adjacent to the second control circuit block;
   wherein in the cross direction, a second offset distance is between a second self-illumination block side of the second self-illumination block and a second control circuit block side of the second control circuit block, the second self-illumination block side is away from the first self-illumination block, and the second control circuit block side is adjacent to the first control circuit block; and
   wherein the second offset distance is greater than the first offset distance.

2. The display device according to claim 1, wherein in the cross direction, a first spacing is between a center of a width of the first control circuit block and a center of a width of the second control circuit block, a second spacing is between a center of a width of the first self-illumination block and a center of a width of the second self-illumination block, and the second spacing is greater than the first spacing.

3. The display device according to claim 1, wherein in the cross direction, the first control circuit block is narrower than the first self-illumination block, and the second control circuit block is narrower than the second self-illumination block.

4. The display device according to claim 1, wherein in the cross direction, a control circuit block average width of the first control circuit block and the second control circuitblock is less than a self-illumination block average width of the first self-illumination block and the second self-illumination block.

5. The display device according to claim 1, further comprising a connection layer, disposed between the control circuit layer and the self-illumination layer, wherein the connection layer comprises:
   a first connection line, wherein two ends of the first connection line are respectively connected to the first control circuit block and the first self-illumination block; and
   a second connection line, wherein two ends of the second connection line are respectively connected to the second control circuit block and the second self-illumination block, wherein a projection length of the second connection line in the cross direction is greater than a projection length of the first connection line in the cross direction.

6. A display device, comprising:
   a control circuit layer, having a second control circuit block and a third control circuit block, wherein the second control circuit block and the third control circuit block are adjacently arranged along a cross direction;
   a self-illumination layer, disposed on the control circuit layer, and having a second self-illumination block and a third self-illumination block, wherein the second self-illumination block and the third self-illumination block are adjacently arranged along the cross direction, and respectively correspond to the second control circuit block and the third control circuit block for signal connection;
   an edge zone, disposed outside a third side of the third circuit control block away from the second circuit control block, wherein the third self-illumination block in the cross direction partly covers the edge zone;
   wherein, in the cross direction, a second offset distance is between a second self-illumination block side of the second self-illumination block and a second control circuit block side of the second control circuit block, the second self-illumination block side is adjacent to the third self-illumination block, and the second control circuit block side is adjacent to the third control circuit block; and
   wherein in the cross direction, a third offset distance is between a third self-illumination block side of the third self-illumination block and a third control circuit block side of the third control circuit block, the third self-illumination block side is away from the second self-illumination block, the third control circuit block side is away from the second control circuit block, and the third offset distance is greater than the second offset distance.

7. A display device, having a first side, and comprising:
   a control circuit layer, having a plurality of control circuit blocks distributed along a cross direction perpendicular to the first side; and
   a self-illumination layer, disposed on the control circuit layer, and having a plurality of self-illumination blocks distributed along the cross direction and that respectively correspond to the plurality of control circuit blocks, wherein each of the self-illumination blocks is in signal connection with one of the control circuit blocks;
   wherein, in the cross direction, a first offset distance is between a first self-illumination block side of the first self-illumination block and a first control circuit block side of the first control circuit block, the first self-illumination block side is adjacent to the second self-illumination block, and the first control circuit block side is adjacent to the second control circuit block;
   wherein in the cross direction, a second offset distance is between a second self-illumination block side of the second self-illumination block and a second control circuit block side of the second control circuit block, the second self-illumination block side is away from the first self-illumination block, and the second control circuit block side is adjacent to the first control circuit block; and
   wherein the second offset distance is greater than the first offset distance.

8. The display device according to claim 7, wherein arrangement of the control circuit blocks in the cross direction forms a first continuous structure, and the first continuous structure repeats a first repeated structural feature in every first distance; and
   wherein arrangement of the self-illumination blocks in the cross direction forms a second continuous structure, the second continuous structure repeats a second repeated structural feature in every second distance, and the second distance is greater than the first distance.

9. The display device according to claim 7, wherein in the cross direction, an averaged control circuit block width of the control circuit blocks is less than an averaged self-illumination block width of the self-illumination blocks.

10. The display device according to claim 7, further comprising a connection layer, disposed between the control circuit layer and the self-illumination layer, wherein the connection layer comprises:
   a plurality of first connection lines, wherein two ends of each of the first connection lines are respectively connected to one of the control circuit blocks and one of the self-illumination blocks; and
   a second connection line, having a larger projection length in the cross direction than each of the first connection lines, wherein the second connection line is closer to the first side than each of the first connection lines.

11. The display device according to claim 7, further comprising an edge zone, disposed outside the plurality of circuit control blocks, wherein one of the self-illumination blocks closest to a first side covers at least partially the edge zone.

* * * * *